(12) United States Patent
Dunsmore et al.

(10) Patent No.: US 6,448,786 B1
(45) Date of Patent: Sep. 10, 2002

(54) STIMULUS/RESPONSE SYSTEM AND METHOD FOR VECTOR CHARACTERIZATION OF FREQUENCY TRANSLATION DEVICES

(75) Inventors: Joel P. Dunsmore, Sebastopol, CA (US); Michael E Knox, Manhasset, NY (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/710,978

(22) Filed: Nov. 9, 2000

(51) Int. Cl.[7] .............................................. G01R 35/00
(52) U.S. Cl. ..................................................... 324/601
(58) Field of Search ........................... 324/76.12, 76.23, 324/76.43, 601, 615, 638; 455/291, 296, 561; 342/367, 463; 375/224, 232; 382/190; 370/204, 343, 345; 327/105

(56) References Cited

U.S. PATENT DOCUMENTS 6,064,694 A * 5/2000 Clark et al. .................. 375/224

OTHER PUBLICATIONS

Jim Fitzpatrick, Hewlett–Packard, Santa Rosa, California; "Error Models for Systems Measurement"; Microwave Journal, May 1978; 5 pages.

User's Guide, HP 8753E Network Analyzer; Hewlett–Packard, HP Part No. 08753–90367, Oct. 1998; 2 pages.

* cited by examiner

*Primary Examiner*—N. Le
*Assistant Examiner*—Etienne P. LeRoux
(74) *Attorney, Agent, or Firm*—John L. Imperato

(57) ABSTRACT

A vector stimulus/response system enables the vector responses of frequency translation devices (FTDs) to be accurately characterized. The system includes a source, having a predetermined source match, reflection tracking and directivity, that generates a stimulus signal. A receiver having a predetermined load match is also included in the system. The receiver measures a first series of responses of a reference translator to the stimulus signal, when the reference translator is coupled between the source and receiver. The reference translator has predetermined transmission characteristics, input match and output match. The receiver measures a second series of responses of a FTD to the stimulus signal. A processor generates a correction array from the first series of responses, the predetermined transmission characteristics, input match output match, source match, and the directivity, reflection tracking and load match. The processor then applies the generated correction array to modify the second series of responses to provide vector characteristics of the FTD. A phase coherent reference and an amplitude reference for the receiver are provided by a parallel reference path or by a series reference path. The systems are alternatively implemented according to a method for vector characterization of frequency translation devices.

20 Claims, 3 Drawing Sheets

US 6,448,786 B1

STIMULUS/RESPONSE SYSTEM AND METHOD FOR VECTOR CHARACTERIZATION OF FREQUENCY TRANSLATION DEVICES

BACKGROUND OF THE INVENTION

Vector Network Analyzers (VNAs) enable vector responses of many types of electrical and optical devices to be accurately characterized. However, presently available VNAs are not well suited for vector characterization of mixers, modulators, and other types of frequency translation devices. Frequency translation devices (FTDs) provide output signals at frequencies that are different from the frequencies of input signals that are applied to the FTDs, resulting in inaccuracies in the characterization of FTDs, caused by impedance mismatches, response unflatness and lack of phase reference inherent in the VNAs. Because FTDs are critical to the performance of communication systems in which they are included, there is a need for a system that enables accurate characterization of the vector, or magnitude and phase, responses of FTDs.

SUMMARY OF THE INVENTION

A vector stimulus/response system constructed according to the preferred embodiment of the present invention enables the magnitude and phase responses of FTDs to be accurately characterized. The system includes a source, having a predetermined source match, reflection tracking and directivity, that generates a stimulus signal. A receiver having a predetermined load match is also included in the vector stimulus/ response system. The receiver measures a first series of responses of a reference translator to the stimulus signal, when the reference translator is coupled between the source and receiver. The reference translator has predetermined transmission characteristics, input match and output match. The receiver measures a second series of responses of a FTD to the stimulus signal when the FTD is coupled between the source and the receiver. A processor generates a correction array from the first series of responses, the predetermined transmission characteristics, input match output match, source match, and the directivity, reflection tracking and load match. The processor then applies the generated correction array to modify the second series of responses to provide vector characteristics of the FTD.

In a first preferred embodiment of the present invention, a phase coherent reference and an amplitude reference for the receiver are provided by a parallel reference path having a reference FTD. In a second preferred embodiment of the present invention, a phase coherent reference and an amplitude reference for the receiver are provided by a series complimentary reference path having a reference FTD performing an up-conversion when the reference translator and the measurement FTD down-convert the stimulus signal, and performing a down-conversion when the reference translator and the measurement FTD up-convert the stimulus signal. The preferred embodiments of the present invention are alternatively implemented according to a method for vector characterization of frequency translation devices.

DETAILED DESCRIPTION OF THE PREFERRED EMBODIMENT

Figure 1:
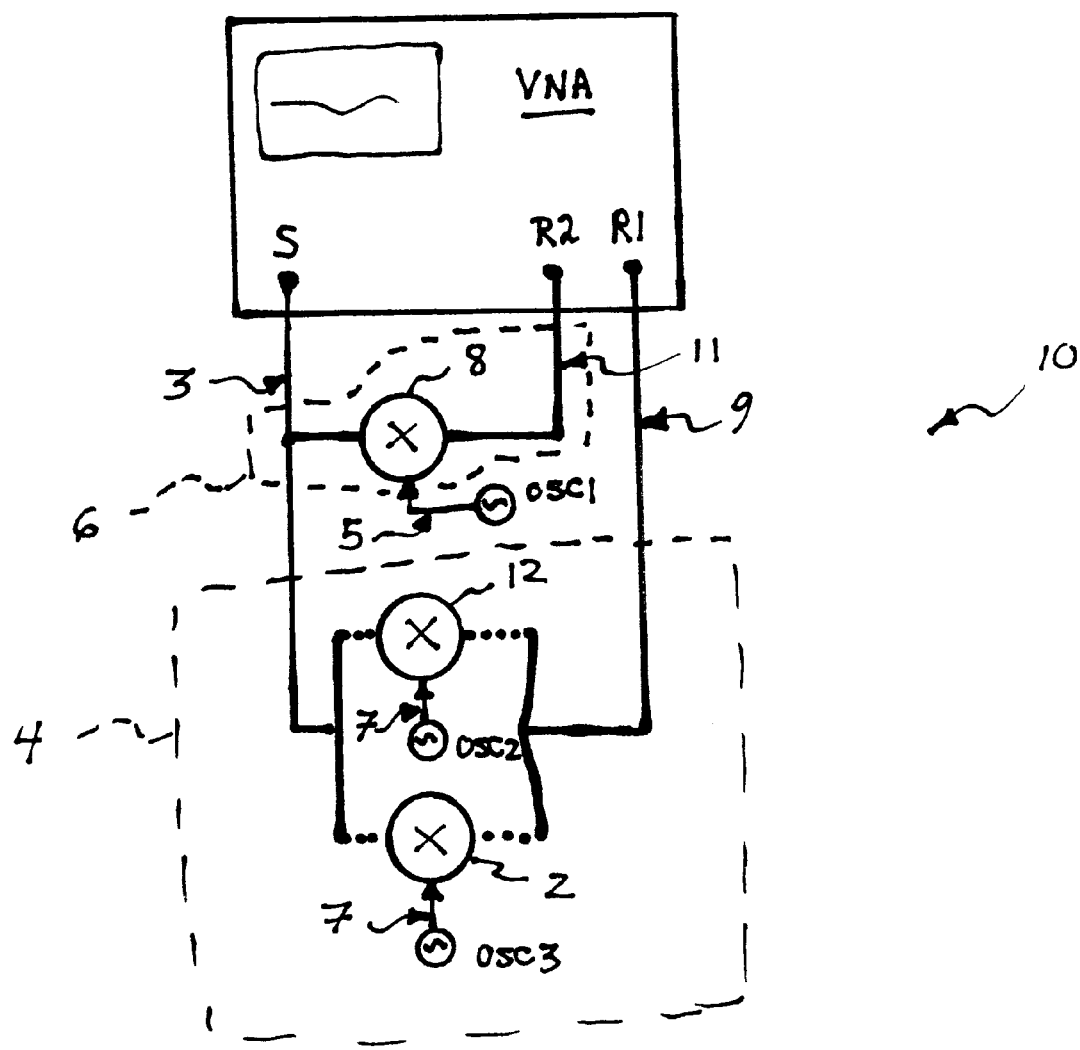
FIG. 1 shows a first system for characterizing a frequency translation device (FTD) constructed according to the first preferred embodiment of the present invention.

FIG. 1 shows a vector stimulus/response system 10 for characterizing a frequency translation device (FTD) 2, constructed according to the first preferred embodiment of the present invention. The vector stimulus/response system 10 includes a source S and receivers R1, R2. The source S generates a stimulus signal 3. The receivers R1, R2 provide measurements of magnitude and phase responses, or vector response, of devices coupled between the source S and receivers R1, R2. The integrated source and receivers of a vector network analyzer (VNA) are well-suited as the source S and the receivers R1, R2 in the system 10. Other types of stimulus/response instruments having vector, or magnitude and phase, measurement capability are alternatively used as the source S and the receivers R1, R2.

A measurement path 4 is provided between the source S and the receiver R1. A parallel reference path 6 is provided between the source S and the receiver R2. The reference path 6 includes a reference FTD 8 that receives the stimulus signal 3 from source S. The measurement path 4 includes either a reference translator 12 or the measurement FTD 2 that are alternatively inserted in the measurement path 4 between the source S and the receiver R1, so that the reference FTD 8 and either the reference translator 12 or the measurement FTD 2 each receive the stimulus signal 3. The reference translator 12, the reference FTD 8 and the measurement FTD 2 are mixers, modulators, or subsystems that receive the stimulus signal 3 and drive signals 5, 7 from phase coherent oscillators OSC1–OSC3, that are individually either internal or external to the reference translator 12, the reference FTD 8 and measurement FTD 2. The reference translator 12, the reference FTD 8 and the measurement FTD 2 provide frequency translated output signals 9, 11 according to the frequencies of the applied stimulus signal 3 and drive signals 5, 7. The drive signals 5, 7 are alternatively provided by a single oscillator or two oscillators (not shown).

The source S in the vector stimulus/response system 10 has a predetermined source match $E_{SF}$, reflection tracking $E_{RF}$ and directivity $E_{DF}$. The receiver R1 has a predetermined load match $E_{LF}$. The receiver R1 measures a first series of responses of the reference translator 12 to the stimulus signal 3, when the reference translator 12 is inserted in the measurement path 4. The output signal 11 is received by the receiver R2 and provides an amplitude reference and a phase coherent reference for the receiver R1.

Figure 2:
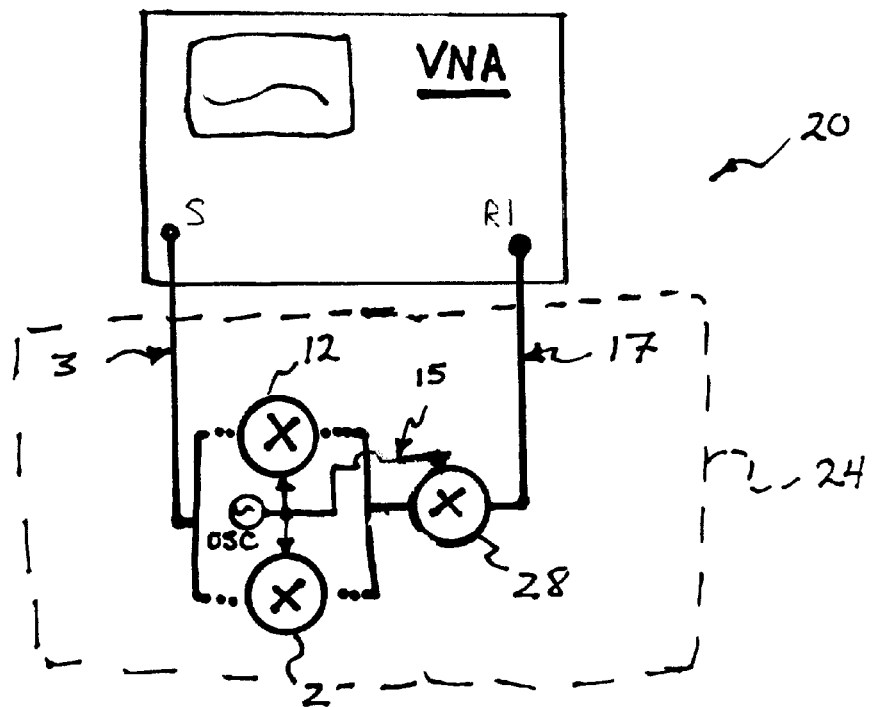
FIG. 2 shows a second system for characterizing a frequency translation device (FTD) constructed according to the second preferred embodiment of the present invention.

FIG. 2 shows a vector stimulus/response system 20 for characterizing a frequency translation device (FTD) 2, constructed according to the second preferred embodiment of the present invention. The vector stimulus/response system 20 includes a source S and a receiver R1. The source S generates a stimulus signal 3. The receiver R1 provides measurements of magnitude and phase responses, or vector response of devices coupled between the source S and receiver R1. The integrated source and receivers of a vector network analyzer (VNA) are well-suited as the source S and the receiver R1 in the system 20. Other types of stimulus/ response instruments having vector, or magnitude and phase, measurement capability are alternatively used as the source S and the receiver R1.

A measurement path 24 is provided between the source S and the receiver R1. The measurement path 24 includes a reference FTD 28, and either a reference translator 12 or the measurement FTD 2, that are alternatively coupled in the measurement path 24 between the source S and the receiver R1 through the reference FTD 28. The reference translator 12, the reference FTD 28 and measurement FTD 2 are mixers, modulators, or subsystems that receive drive signal 15 from a single oscillator OSC, or alternatively, from multiple phase coherent oscillators(not shown) that are individually either internal or external to the reference translator 12, the reference FTD 28 and measurement FTD 2. The reference translator 12 and the measurement FTD 2 provide frequency translated signals according to the frequencies of the applied stimulus signal 3 and the drive signal 15. Complimentary frequency conversion is provided by the reference FTD 28 so that an output signal 17 at the receiver R1 has the same frequency as the stimulus signal 3. For example, the reference FTD 28 provides up-conversion when the reference translator 12 and the measurement FTD 2 down-convert the stimulus signal 3, and the reference FTD 28 provides down-conversion when the reference translator and the measurement FTD 2 up-convert the stimulus signal 3. The reference FTD 28 forms a series complimentary reference path for the reference translator 12 and the FTD 2, establishing an amplitude reference and a phase coherent reference for the receiver R1. Under condition that the reference translator 12 or measurement FTD 2 include a frequency translated signal having both a sum and difference frequency component, a filter (not shown) or image-reject mixing technique is used to ensure that only a designated one of the frequency components is incident to the FTD 28 and undergoes the complimentary frequency conversion by the reference FTD 28.

The source S in the vector stimulus/response system 20 has a predetermined source match $E_{SF}$, reflection tracking $E_{RF}$ and directivity $E_{DF}$. The combination of the reference FTD 28 and the receiver R1 have a predetermined load match $E_{LF}$. While the reference FTD 28 is shown coupled to the receiver R1 in FIG. 2, the reference FTD 28 is alternatively coupled to the source S. Under the condition that the reference FTD 28 is coupled to the source S, the predetermined source match $E_{SF}$, reflection tracking $E_{RF}$ and directivity $E_{DF}$ each include the effects of the reference FTD 28 in combination with the source S, and the predetermined load match $E_{LF}$ is that of the receiver R1. In either coupling configuration of the FTD 28, the receiver R1 measures a first series of responses of the reference translator 12 to the stimulus signal 3, when the reference translator 12 is inserted in the measurement path 24. The output signal 17 is received by the receiver R1, providing an amplitude reference and a phase coherent reference for the receiver R1.

Referring to the vector stimulus/response system 10 of FIG. 1 and the vector stimulus/response system 20 of FIG. 2, the first series of responses includes measured vector forward transmission S-parameter $S21_{M1}$ of the reference translator 12. The reference translator 12 has predetermined transmission characteristics T1, T2, input match D and output match M. Related patent application, Ser. No. 09/591,441, titled "Method For Characterizing Frequency Translation Devices", herein incorporated by reference, discloses a method for determining transmission characteristics T1, T2, input match D and output match M for a reference translator 12 that is reciprocal, having T1 equal to T2. However, other techniques for determining transmission characteristics T1, T2, input match D and output match M for the reference translator 12 are suitable for use in the preferred embodiments of the present invention.

Figure 3A:
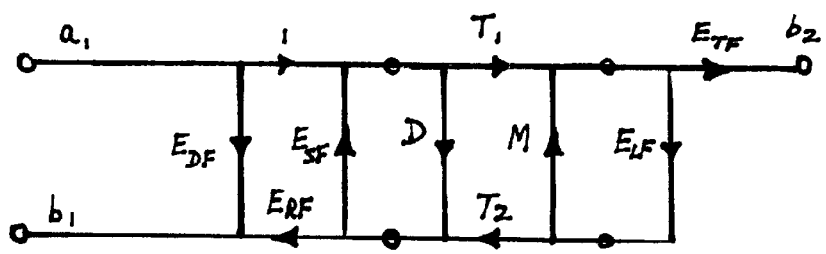
FIGS. 3A–C are signal flow graphs corresponding to the systems of FIG. 1 and FIG. 2.

FIG. 3A is a signal flow graph corresponding to the first series of measured responses measured by the receiver R1.

A processor (not shown), either internal or external to the VNA generates a correction array from the first series of measured responses. The correction array contains the source match $E_{SF}$, the directivity $E_{DF}$, the reflection tracking $E_{RF}$ and the load match $E_{LF}$. From application of known signal flow graph techniques to the signal flow graph of FIG. 3A, a transmission tracking $E_{TF}$ is derived according to the following relationship:

$$E_{TF}=(S21_{M1}/(T1))/(1-M*E_{LF}-D*E_{SF}-E_{SF}*T1*T2*E_{LF}+E_{SF}*M*D*E_{LF}),$$

where $S21_{M1}=b_2/a_1$, the measured vector forward transmission S-parameter of the reference translator 12.

Figure 3B:
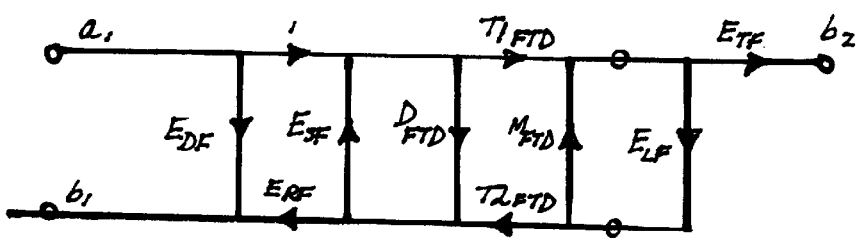
Figure 3C:
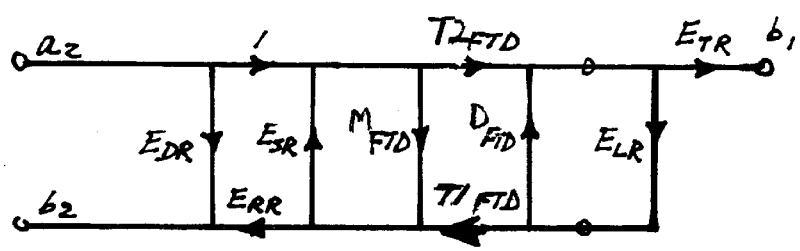

The FTD 2 is inserted in the measurement path 4 and the receiver R1 measures a second series of responses to the stimulus signal 3. FIGS. 3B–3C are signal flow graphs corresponding to the second series of measured responses. The processor then applies the generated correction array to modify the second series of responses to provide vector, or magnitude and phase, characteristics of the measurement FTD 2. These characteristics of the FTD 2 include transmission characteristics $T1_{FTD}$, $T2_{FTD}$, input match $D_{FTD}$ and output match $M_{FTD}$. There are various alternatives to the responses that are included in the second series of responses.

In a first alternative, having the corresponding signal flow graph of FIG. 3B, the second series of responses includes a measured vector forward transmission S-parameter $S21_{M2}$ of the FTD 2, where $S21_{M2}=b_2/a_1$. The input match $D_{FTD}$, output match $M_{FTD}$ and transmission characteristic $T2_{FTD}$ of the FTD 2 are set to zero. Application of the generated correction array to modify the second series of responses results in a forward transmission vector response $T1_{FTD}$ of the FTD 2, where $T1_{FTD}=S21_{M2}/E_{TF}$. Transmission tracking $E_{TF}$ is as previously derived.

In a second alternative, having the corresponding signal flow graph of FIG. 3B, the second series of responses includes the measured vector forward transmission S-parameter $S21_{M2}$ and a measured vector forward reflection S-parameter $S11_{M2}$ of the FTD 2, where $S11_{M2}=b_1/a_1$. The output match $M_{FTD}$ and transmission characteristic $T2_{FTD}$ are set to zero. Application of the generated correction array to modify the second series of responses then results in a forward transmission characteristic $T1_{FTD}$ of the FTD 2, where $T1_{FTD}=S21_{M2}/(E_{TF}((S11_{M2}-E_{DF})E_{SF}/E_{RF}+1))$. In a typical VNA, the source S generates the stimulus signal 3 and also has capability to measure magnitude and phase of reflected signals from the FTD 2, so that the forward reflection S-parameter $S11_{M2}$ is readily measured.

In a third alternative, having the corresponding signal flow graphs of FIGS. 3B–3C, the second series of measured responses includes the forward transmission S-parameter $S21_{M2}$, the forward reflection S-parameter $S11_{M2}$ and a measured vector reverse reflection S-parameter $S22_{M2}$ of the FTD 2 where $S22_{M2}=b_2/a_2$ and $b_2$ and $a_2$ are signal flow graph terms as shown in FIG. 3B. The correction array in this alternative accommodates for a predetermined reverse source match $E_{SR}$, a reverse transmission tracking $E_{RR}$ and reverse directivity $E_{DR}$ of the source S. The correction array also accommodates for a predetermined reverse load match $E_{LR}$ of the receiver R1. The transmission characteristic $T2_{FTD}$ is set to zero. Application of the generated correction array to modify the second series of responses then results in a forward transmission characteristic $T1_{FTD}$ of the FTD 2, where $T1_{FTD}=(1+((S22_{M2}-E_{DR})/E_{RR})(E_{SR}-E_{LF}))(S21_{M2}/E_{TF})/((1+(S11_{M2}-E_{DF})(E_{SF}/E_{RF}))(1+(S22_{M2}-E_{DR})(E_{SR}/E_{RR})))$. In a typical VNA, t receiver R1 measures magnitude and phase of output signals from the FTD 2 and also has capability to generate an output stimulus (not shown) to the FTD 2, so that the reverse reflection S-parameter $S22_{M2}$ is readily measured.

In a fourth alternative, having the corresponding signal flow graphs of FIGS. 3B–3C, the second series of measured responses includes the forward transmission S-parameter $S21_{M2}$, the forward reflection S-parameter $S11_{M2}$, the reverse reflection S-parameter $S22_{M2}$, and a measured vector reverse transmission S-parameter $S12_{M2}$ of the FTD 2, where $S12_{M2}=b_1/a_2$ and $b_1$, and $a_2$ are signal flow graph terms as shown in FIG. 3B. The correction array in this alternative accommodates for the predetermined reverse source match $E_{SR}$, the reverse transmission tracking $E_{RR}$ and the reverse directivity $E_{DR}$ of the source S. The correction array also accommodates for a predetermined reverse load match $E_{LR}$ of the receiver R1. The first series of responses in this alternative includes a measured vector reverse transmission S-parameter $S12_{M1}$, of the reference translator 12. The reverse transmission tracking $E_{TR}$ is derived according to the following relationship:

$$E_{TR}=(S12_M/(T1))/(1-M^*E_{LR}-D^*E_{SR}-E_{SR}^*T1^*T2^*E_{LR}+E_{SR}^*M^*D^*E_{LR})$$

Application of the generated correction array to modify the second series of responses then results in a forward transmission characteristic $T1_{FTD}$ of the FTD 2, where $T1_{FTD}=(1+((S22_{M2}-E_{DR})/E_{RR})(E_{SR}-E_{LF}))(S21_{M2}/E_{TF})/((1+((S11_{M2}-E_{DF})/E_{RF})E_{SF})(1+((S22_{M2}-E_{SR})-(S21_{M2}S12_{M2}E_{LF}E_{LR}/(E_{TF}-E_{TR})))$.

Additional vector characteristics of the FTD 2, such as the transmission characteristic $T2_{FTD}$, input match $D_{FTD}$ and output match $M_{FTD}$, are readily extracted from application of the generated correction array to modify the second series of measured responses, using the following known relationships between these terms and measured responses:

$$D_{FTD} = \frac{\frac{(S11_{M2}-E_{DF})}{E_{RF}}\left(1+\frac{(S22_{M2}-E_{DR})E_{SR}}{E_{RR}}\right) - \frac{S21_{M2}S12_{M2}E_{LF}}{E_{TF}E_{TR}}}{\left(1+\frac{(S11_{M2}-E_{DF})E_{SF}}{E_{RF}}\right)\left(1+\frac{(S22_{M2}-E_{DR})E_{SR}}{E_{RR}}\right) - \frac{S21_{M2}S12_{M2}E_{LF}E_{LR}}{E_{TF}E_{TR}}}$$

$$T2_{FTD} = \frac{\left(1+\frac{(S11_{M2}-E_{DF})}{E_{RF}}(E_{SR}-E_{LF})\right)\frac{S12_{M2}}{E_{TR}}}{\left(1+\frac{(S11_{M2}-E_{DF})E_{SF}}{E_{RF}}\right)\left(1+\frac{(S22_{M2}-E_{DR})E_{SR}}{E_{RR}}\right) - \frac{S21_{M2}S12_{M2}E_{LF}E_{LR}}{E_{TF}E_{TR}}}$$

$$M_{FTD} = \frac{\frac{(S22_{M2}-E_{DR})}{E_{RR}}\left(1+\frac{(S11_{M2}-E_{DF})E_{SF}}{E_{RF}}\right) - \frac{S21_{M2}S12_{M2}E_{LR}}{E_{TF}E_{TR}}}{\left(1+\frac{(S11_{M2}-E_{DF})E_{SF}}{E_{RF}}\right)\left(1+\frac{(S22_{M2}-E_{DR})E_{SR}}{E_{RR}}\right) - \frac{S21_{M2}S12_{M2}E_{LF}E_{LR}}{E_{TF}E_{TR}}}$$

The preferred embodiments of the present invention are alternatively implemented according to a method for vector characterization of an FTD 2. In a first step of the method, a stimulus signal 3 is generated from the source S having a predetermined source match $E_{SF}$, reflection tracking $E_{RF}$ and directivity $E_{DF}$. In a second step, a first series of responses of a reference translator 12 to the stimulus signal 3 is measured when the reference translator 12 is coupled between the source S and a receiver R1 having a predetermined load match $E_{LF}$, an amplitude reference and a phase coherent reference. In a third step, a second series of responses of the FTD 2 to the stimulus signal 3 is measured when the FTD 2 is coupled between the source S and the receiver R1. The reference translator 12 has predetermined transmission characteristics T1, T2 input match D and output match M. In a fourth step, a correction array is generated from the first series of responses, the predetermined transmission characteristics T1, T2 input match D and output match M, the source match $E_{SF}$, the directivity $E_{DF}$, the reflection tracking $E_{RF}$ and the load match $E_{LF}$. In a fifth step, the generated correction array is applied to modify the second series of responses to provide the vector characteristics of the FTD 2.

One or more of the flow graph terms shown in FIGS. 3A–3C can be excluded from the correction array, for example, when such terms are not acquired or when such terms have little influence on the vector characteristics of the FTD 2. Additional error correction techniques such as those that account for cross-talk and other errors can be used in conjunction with the system and method constructed according to the preferred embodiments of the present invention.

While the preferred embodiments of the present invention have been illustrated in detail, it should be apparent that modifications and adaptations to these embodiments may occur to one skilled in the art without departing from the scope of the present invention as set forth in the following claims.

What is claimed is:

1. A vector stimulus/response system for characterizing a frequency translation device (FTD), comprising:

a source having a predetermined source match, having a predetermined reflection tracking and having a predetermined directivity, generating a stimulus signal;

a receiver having a predetermined load match, having an amplitude reference and having a phase coherent reference, measuring a first series of responses of a reference translator to the stimulus signal when the reference translator is coupled between the source and receiver, the reference translator having predetermined transmission characteristics, predetermined input match and predetermined output match, and the receiver measuring a second series of responses of the FTD to the stimulus signal when the FTD is coupled between the source and the receiver; and a processor generating a correction array from the first series of responses, and at least one of the transmission characteristics, the input match, the output match, the source match, the directivity, the reflection tracking and the load match, and applying the generated correction array to modify the second series of responses to provide vector characteristics of the FTD.

2. The system of claim 1 wherein the amplitude reference and the phase coherent reference are provided by a reference path parallel to the source and the receiver.

3. The system of claim 2 wherein the amplitude reference and the phase coherent reference are provided by a series reference path between the source and the receiver, the series reference path providing a complimentary frequency conversion to a frequency conversion provided by each of the reference translator and the FTD.

4. The system of claim 1 wherein the reference translator is reciprocal.

5. The system of claim 1 wherein the vector characteristics of the FTD include at least one of the forward transmission characteristic of the FTD, a reverse transmission characteristic of the FTD, an input match of the FTD, and an output match of the FTD.

6. The system of claim 1 wherein the measured first series of responses includes a forward transmission S-parameter of the reference translator and where generating the correction array includes deriving a transmission tracking.

7. The system of claim 6 wherein the measured second series of responses includes a forward transmission S-parameter of the FTD.

8. The system of claim 7 wherein the measured second series of responses further includes a forward reflection S-parameter of the FTD.

9. The system of claim 8 wherein the measured second series of responses further includes a reverse reflection S-parameter of the FTD.

10. The system of claim 9 wherein the measured second series of responses further includes a reverse transmission S-parameter of the FTD.

11. The system of claim 10 wherein the measured first series of responses further includes a reverse transmission S-parameter of the reference translator and where generating the correction array further includes deriving a reverse transmission tracking.

12. A method for vector characterization of a frequency translation device (FTD), comprising:

generating a stimulus signal from a source having a predetermined source match, a predetermined reflection tracking and a predetermined directivity;

measuring a first series of responses of a reference translator to the stimulus signal with a receiver having a predetermined load match, having an amplitude reference and having a phase coherent reference, when the reference translator is coupled between the source and the receiver, the reference translator having predetermined transmission characteristics, predetermined input match and predetermined output match;

measuring a second series of responses of the FTD with the receiver when the FTD is coupled between the source and the receiver;

generating a correction array from the first series of responses, and at least one of the transmission characteristics and the input match and the output match of the reference translator, the source match, the directivity and the reflection tracking and the load match; and applying the generated correction array to modify the second series of responses to provide vector characteristics of the FTD.

13. The method of claim 12 wherein the reference translator is reciprocal.

14. The method of claim 12 wherein the vector characteristics of the FTD include at least one of the forward transmission characteristic of the FTD, a reverse transmission characteristic of the FTD, an input match of the FTD, and an output match of the FTD.

15. The system of claim 12 wherein the first series of responses includes a forward transmission S-parameter of the reference translator and where generating the correction array includes deriving a transmission tracking.

16. The system of claim 15 wherein the second series of responses includes a forward transmission S-parameter of the FTD.

17. The system of claim 16 wherein the second series of responses further includes a forward reflection S-parameter of the FTD.

18. The system of claim 17 wherein the second series of responses further includes a reverse reflection S-parameter of the FTD.

19. The system of claim 18 wherein the second series of responses further includes a reverse transmission S-parameter of the FTD.

20. The system of claim 19 wherein the first series of responses further includes a reverse transmission S-parameter of the reference translator and where generating the correction array further includes deriving a reverse transmission tracking.

* * * * *